US009547125B2

(12) United States Patent
Assefa et al.

(10) Patent No.: US 9,547,125 B2
(45) Date of Patent: Jan. 17, 2017

(54) BURIED WAVEGUIDE PHOTODETECTOR

(71) Applicant: International Business Machines Corporation, Armonk, NY (US)

(72) Inventors: Solomon Assefa, Ossining, NY (US); William M. Green, Astoria, NY (US); Steven M. Shank, Jericho, VT (US); Yurii A. Vlasov, Katonah, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/694,265

(22) Filed: Apr. 23, 2015

(65) Prior Publication Data

US 2015/0268417 A1 Sep. 24, 2015

Related U.S. Application Data

(62) Division of application No. 13/741,416, filed on Jan. 15, 2013, now Pat. No. 9,117,946.

(51) Int. Cl.
*H01L 27/146* (2006.01)
*G02B 6/12* (2006.01)
(Continued)

(52) U.S. Cl.
CPC ........... *G02B 6/12004* (2013.01); *G02B 6/131* (2013.01); *G02B 6/132* (2013.01); *G02B 6/136* (2013.01);
(Continued)

(58) Field of Classification Search
CPC ........... H01L 31/02327; H01L 21/8238; H01L 27/1461; H01L 27/14643; H01L 31/165; H01L 23/48; H01L 27/14625; H01L 31/0236; H01L 31/0232; H01L 2924/12043; H01L 2933/0058
See application file for complete search history.

(56) References Cited

U.S. PATENT DOCUMENTS 6,307,242 B1 10/2001 Sugiyama
6,897,498 B2 5/2005 Gothoskar et al.
(Continued)

FOREIGN PATENT DOCUMENTS

CN 104124304 A 10/2014
WO 2008080428 A1 7/2008
WO 2014113440 A1 7/2014

OTHER PUBLICATIONS

Cervantes-Gonzalez et al., "Germanium metal-semiconductor-metal photodetectors evanscently coupled with upper-level silicon oxynitride dielectric waveguides", Applied Physics Letter, Dec. 28, 2012, vol. 101, Issue 261109, American Institute of Physics.
(Continued)

*Primary Examiner* — Davienne Monbleau
*Assistant Examiner* — Leslie Pilar Cruz
(74) *Attorney, Agent, or Firm* — Michael LeStrange; Andrew M. Calderon; Roberts Mlotkowski Safran Cole & Calderon, P.C.

(57) ABSTRACT

A method of forming an integrated photonic semiconductor structure having a photodetector and a CMOS device may include forming the CMOS device on a first silicon-on-insulator region, forming a silicon optical waveguide on a second silicon-on-insulator region, and forming a shallow trench isolation (STI) region surrounding the silicon optical waveguide such that the shallow trench isolation electrically isolating the first and second silicon-on-insulator region. Within a first region of the STI region, a first germanium material is deposited adjacent a first side wall of the semiconductor optical waveguide. Within a second region of the STI region, a second germanium material is deposited
(Continued)

adjacent a second side wall of the semiconductor optical waveguide, whereby the second side wall opposes the first side wall. The first and second germanium material form an active region that evanescently receives propagating optical signals from the first and second side wall of the semiconductor optical waveguide.

12 Claims, 17 Drawing Sheets

(51) Int. Cl.
| | |
|---|---|
| *H01L 31/0232* | (2014.01) |
| *H01L 31/18* | (2006.01) |
| *G02B 6/13* | (2006.01) |
| *G02B 6/136* | (2006.01) |
| *H01L 31/0745* | (2012.01) |
| *H01L 31/028* | (2006.01) |
| *G02B 6/132* | (2006.01) |
| *G02B 6/42* | (2006.01) |
| *H01L 21/8238* | (2006.01) |
| *H01L 31/16* | (2006.01) |

(52) U.S. Cl.
CPC ........... *G02B 6/4257* (2013.01); *G02B 6/4291* (2013.01); *H01L 27/1461* (2013.01); *H01L 27/1463* (2013.01); *H01L 27/14643* (2013.01); *H01L 27/14689* (2013.01); *H01L 31/028* (2013.01); *H01L 31/02327* (2013.01); *H01L 31/0745* (2013.01); *H01L 31/1808* (2013.01); *H01L 31/1812* (2013.01); *G02B 2006/121* (2013.01); *G02B 2006/12085* (2013.01); *G02B 2006/12123* (2013.01); *H01L 21/8238* (2013.01); *H01L 31/165* (2013.01); *Y02E 10/547* (2013.01)

(56) References Cited

U.S. PATENT DOCUMENTS

| | | |
|---|---|---|
| 7,151,881 B2 | 12/2006 | West et al. |
| 7,418,166 B1 | 8/2008 | Kapur et al. |
| 7,453,132 B1 * | 11/2008 | Gunn, III ............ H01L 31/0232 257/448 |
| 7,616,904 B1 | 11/2009 | Gunn, III et al. |
| 7,749,872 B2 | 7/2010 | Plummer et al. |
| 7,749,876 B2 | 7/2010 | Barthelmess et al. |
| 8,633,067 B2 | 1/2014 | Assefa et al. |
| 2007/0170536 A1 | 7/2007 | Hsu et al. |
| 2007/0189688 A1 | 8/2007 | Dehlinger et al. |
| 2009/0101909 A1 | 4/2009 | Chen et al. |
| 2010/0327381 A1 | 12/2010 | Morse et al. |
| 2011/0037133 A1 | 2/2011 | Su et al. |
| 2011/0049660 A1 | 3/2011 | Suh et al. |
| 2011/0223706 A1 * | 9/2011 | Hildreth ................ H01L 31/028 438/69 |
| 2014/0197507 A1 | 7/2014 | Assefa et al. |
| 2014/0312443 A1 | 10/2014 | Assefa et al. |

OTHER PUBLICATIONS

European Patent Office, "Notification of Transmittal of the International Search Report and the Written Opinion of the International Searching Authority, or the Declaration", May 27, 2014, International Application No. PCT/US2014/011629.

Masini et al., "Near-infrared waveguide photodetectors based on polycrystalline Ge on silicon-on-insulator substrates", Optical Materials, May 30, 2000, p. 243-246, vol. 17, Elsevier Science B.V.

* cited by examiner

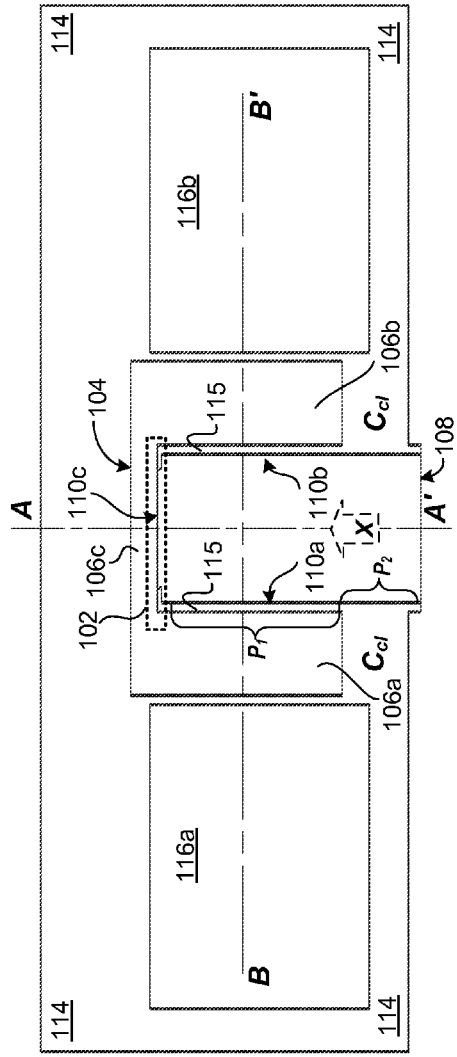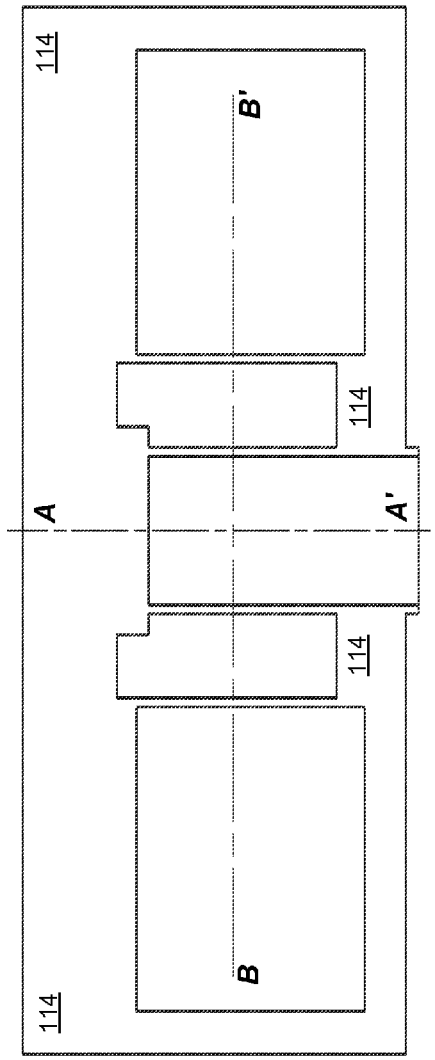
FIG. 1A
FIG. 1B

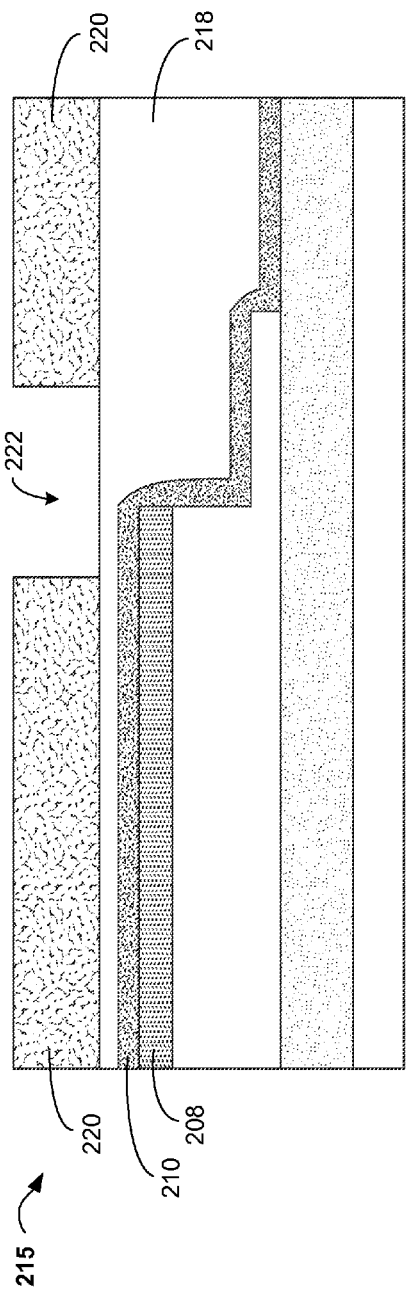
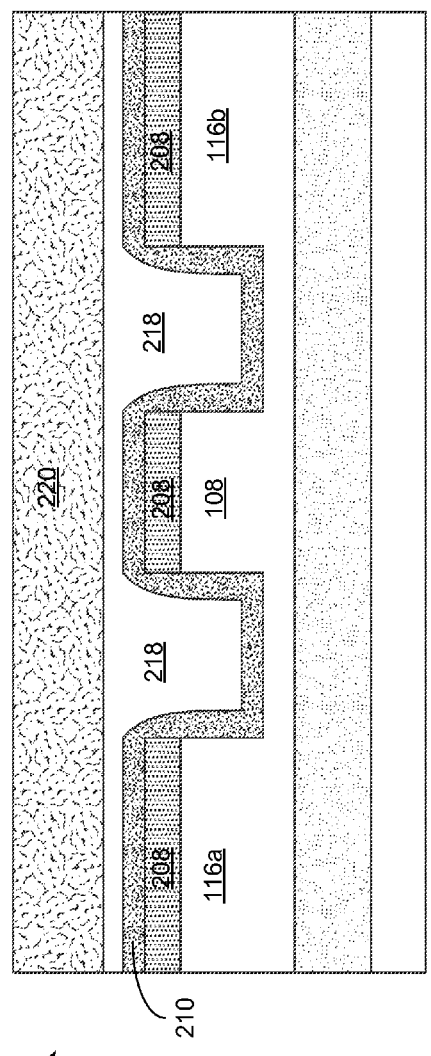

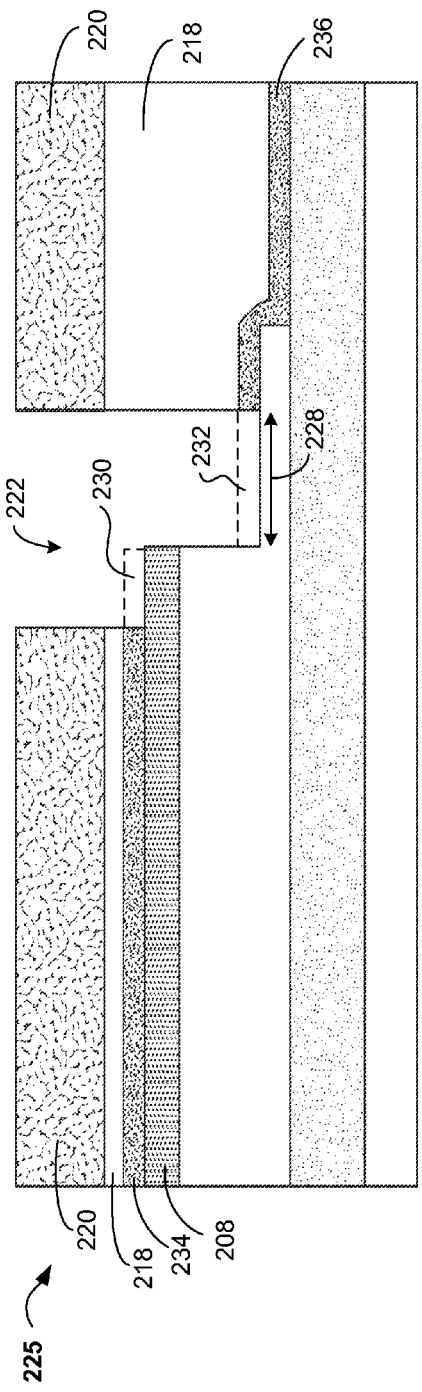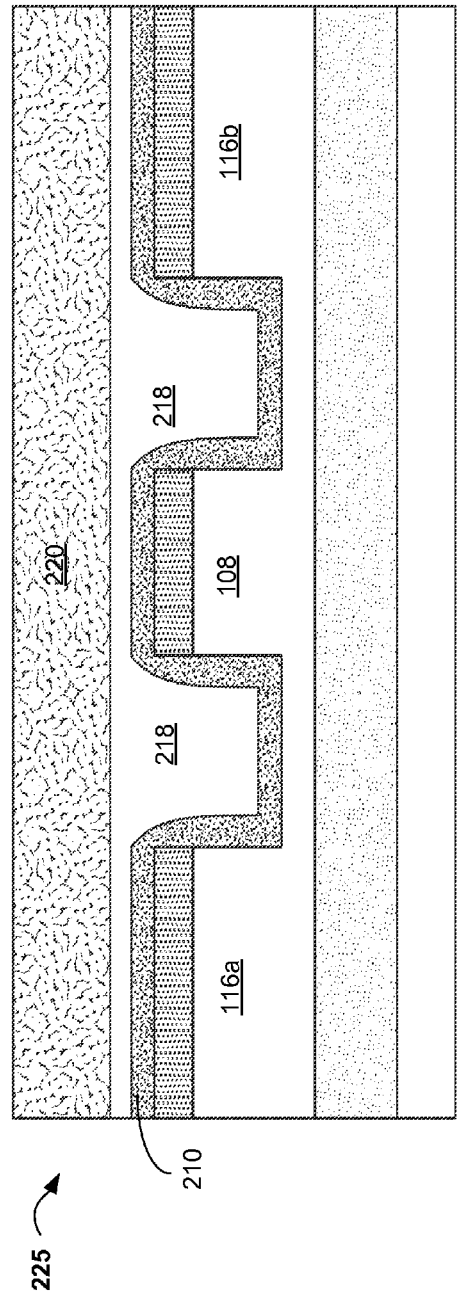
FIG. 2C
FIG. 2C'

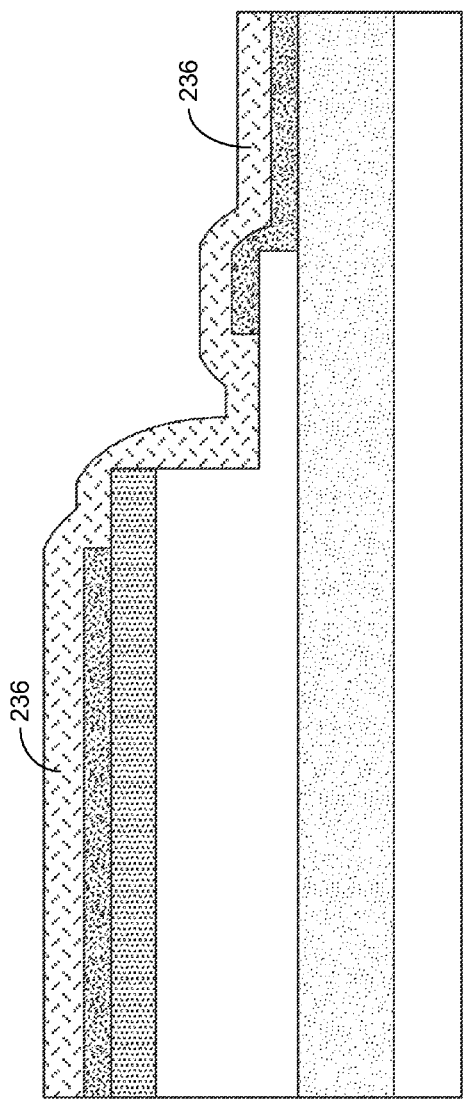
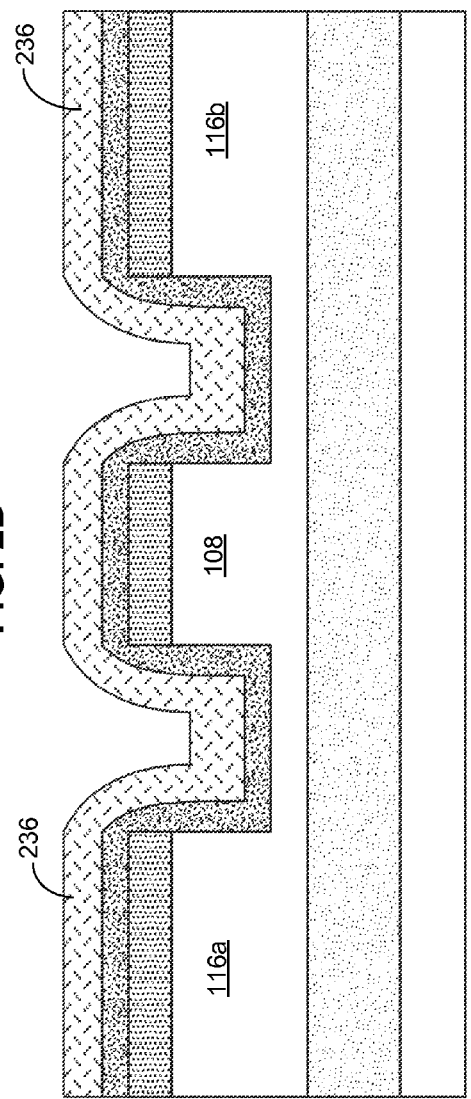

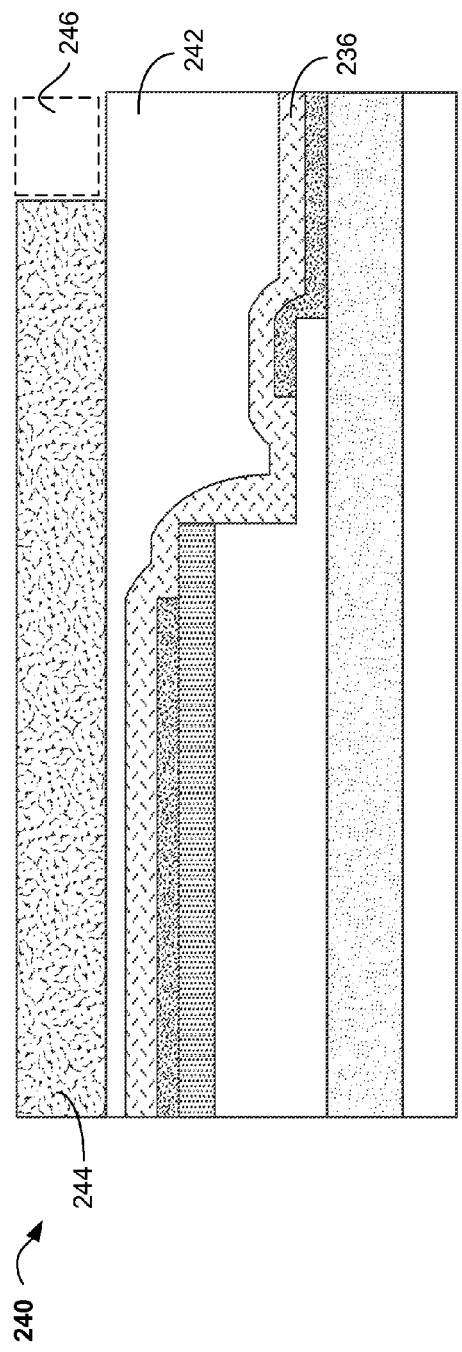
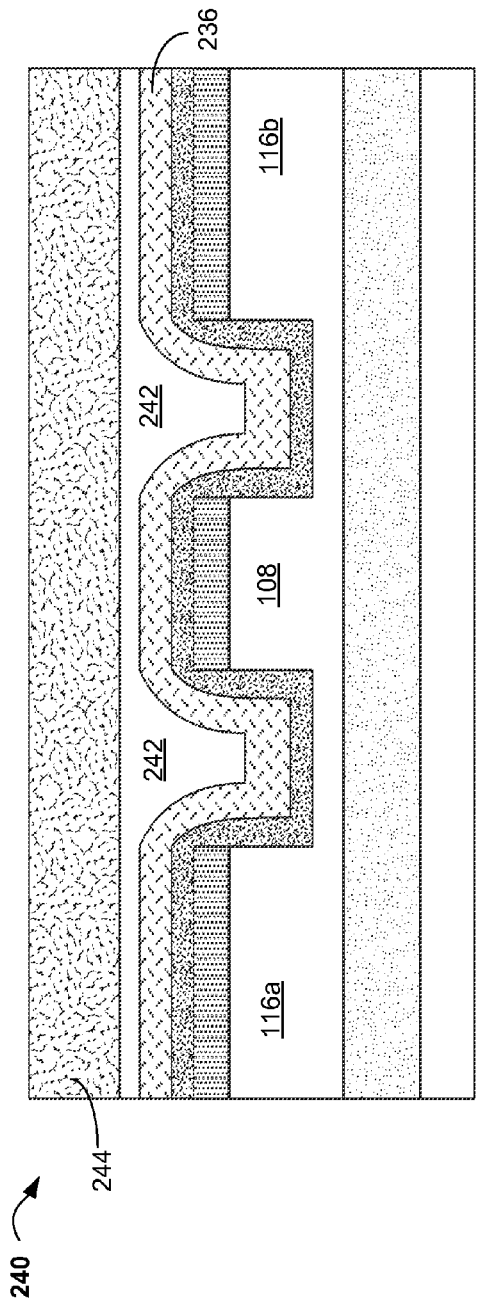
FIG. 2E
FIG. 2E'

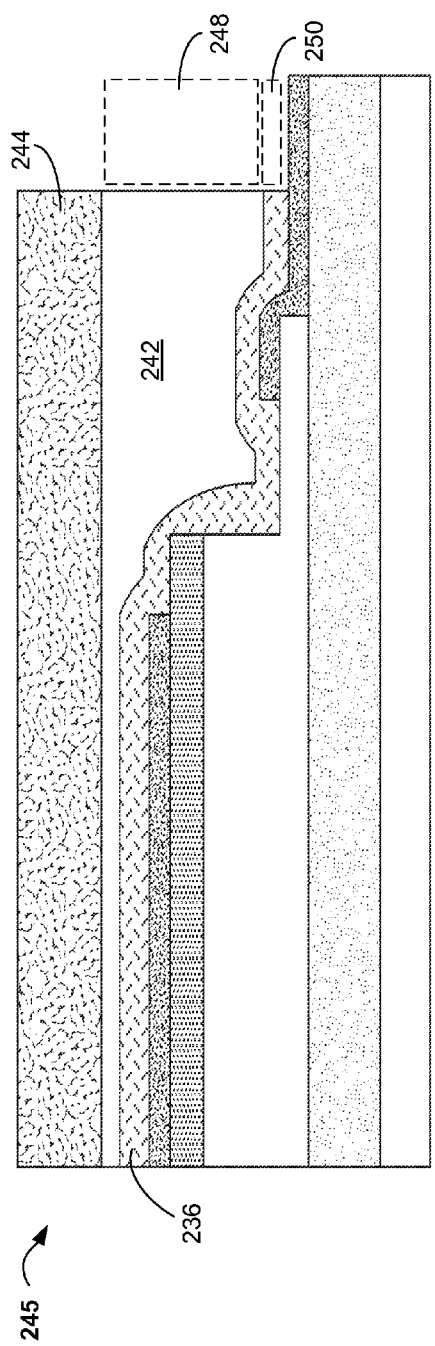
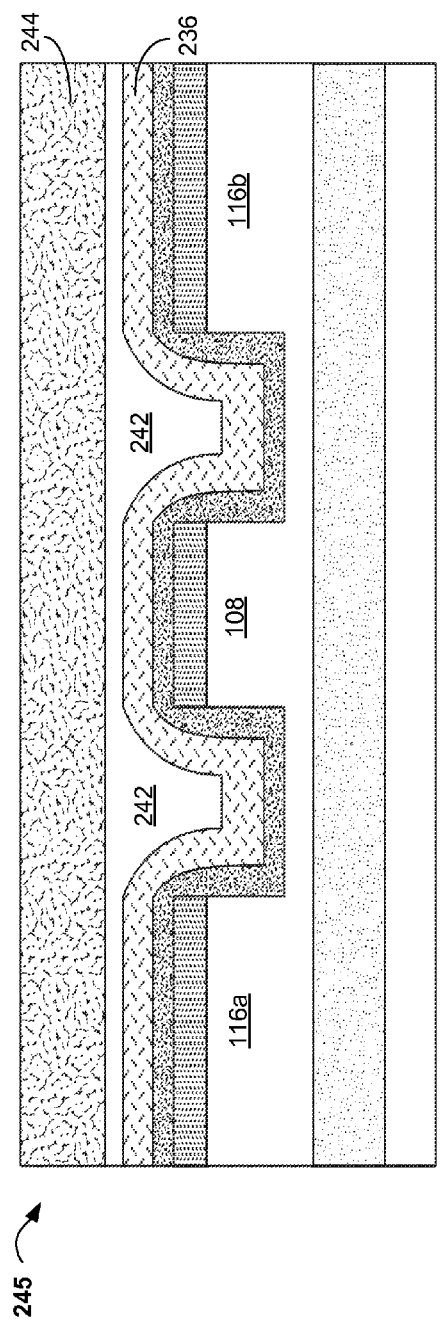

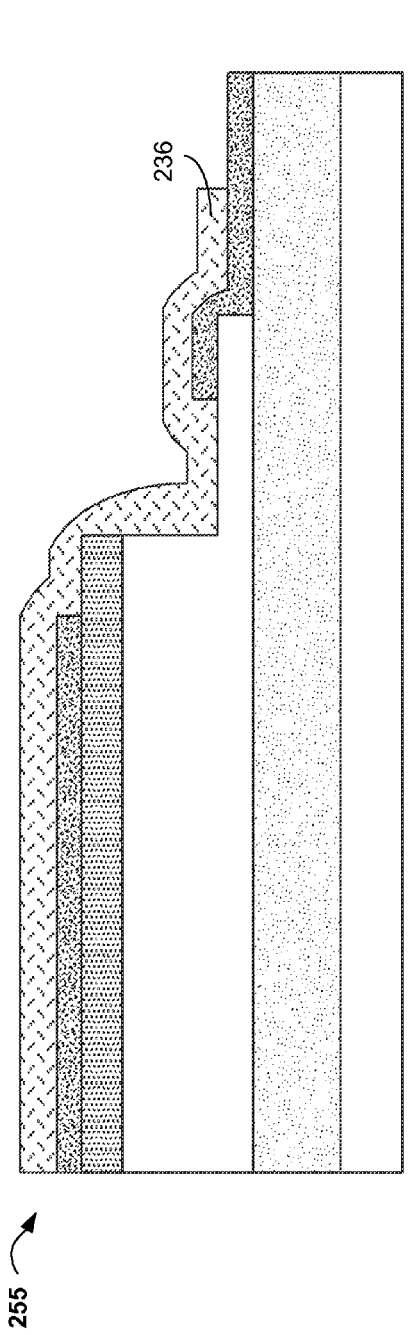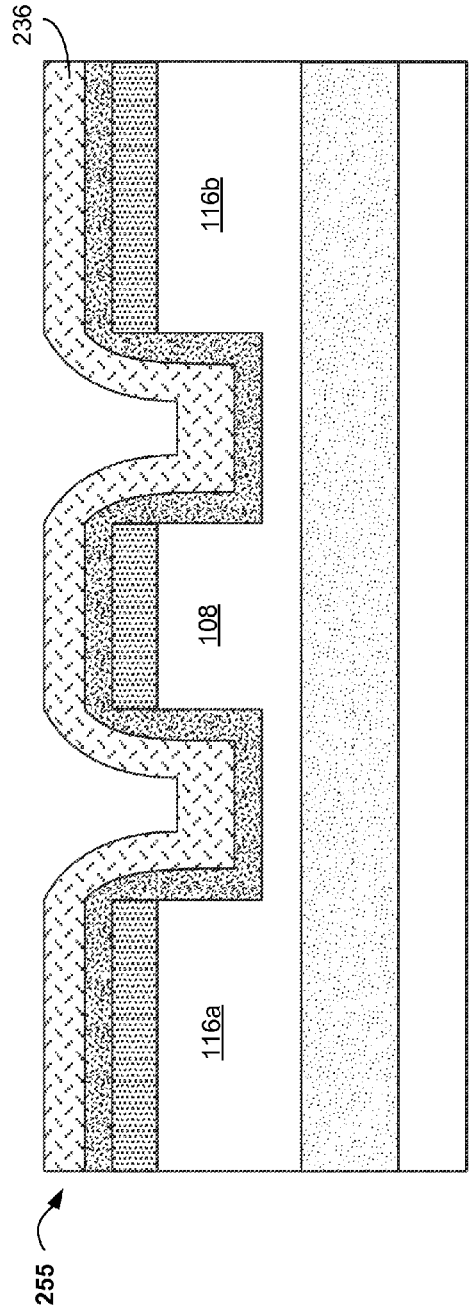

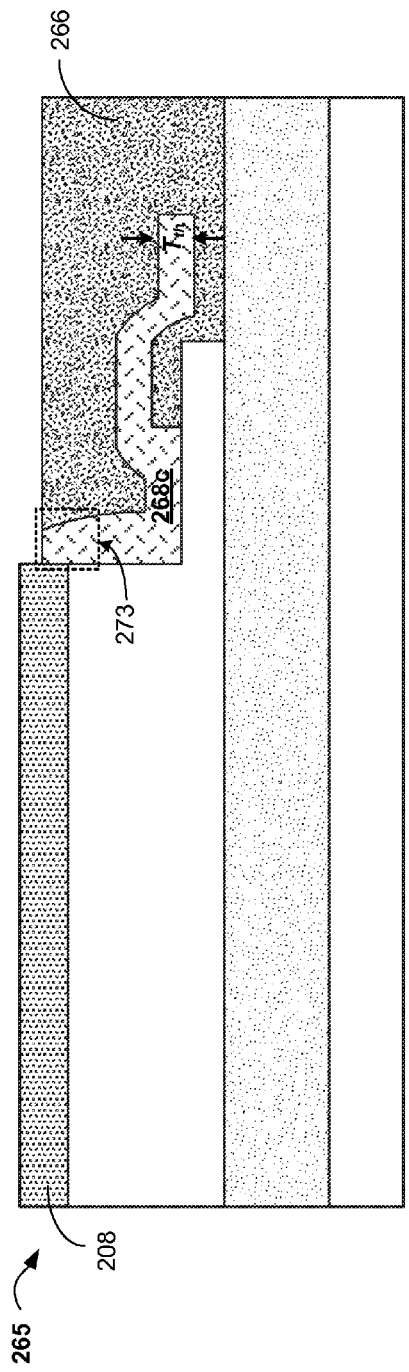
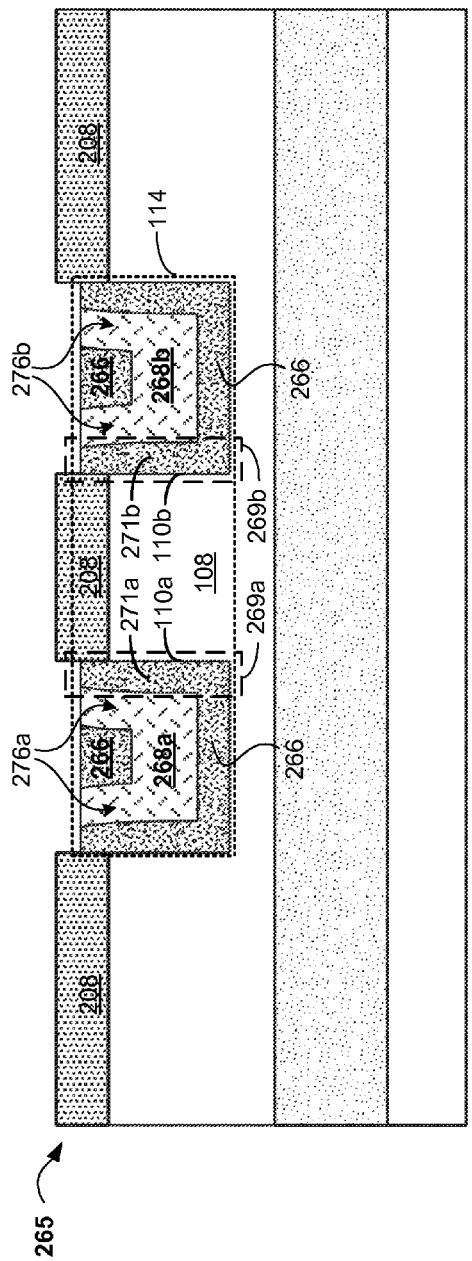
FIG. 2I
FIG. 2I'

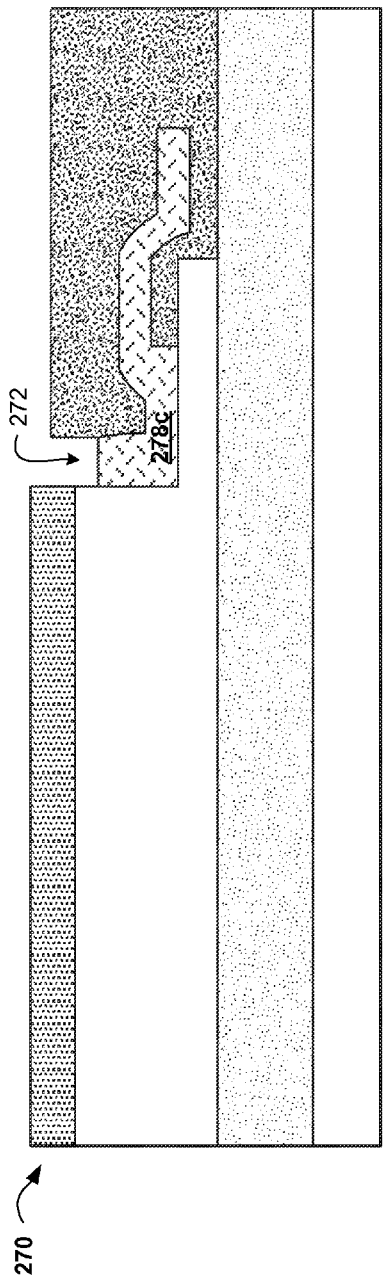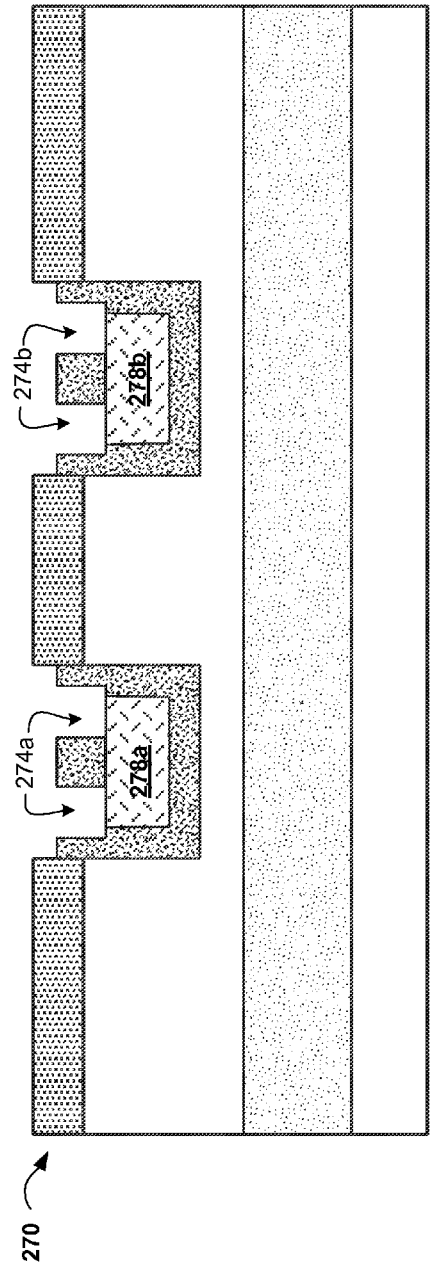
FIG. 2J
FIG. 2J'

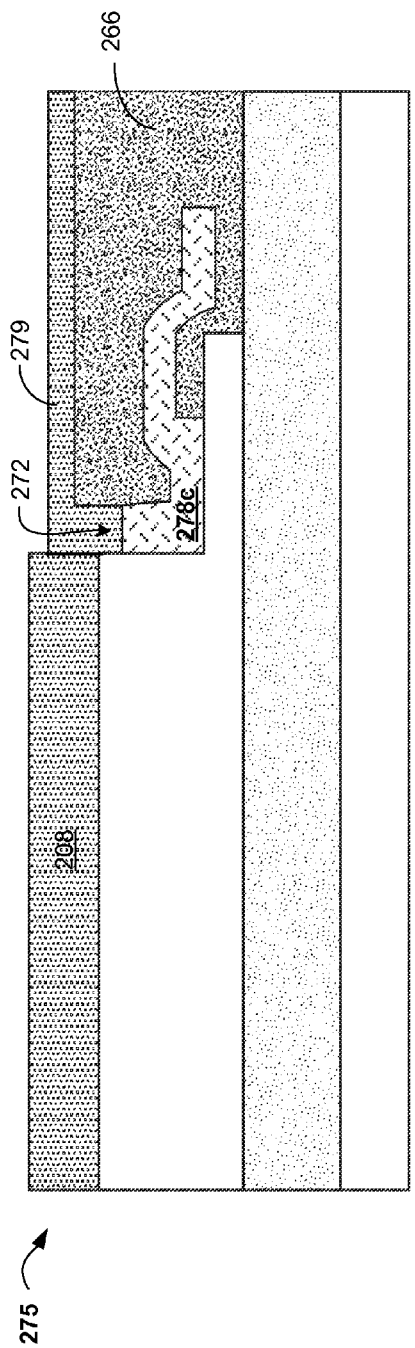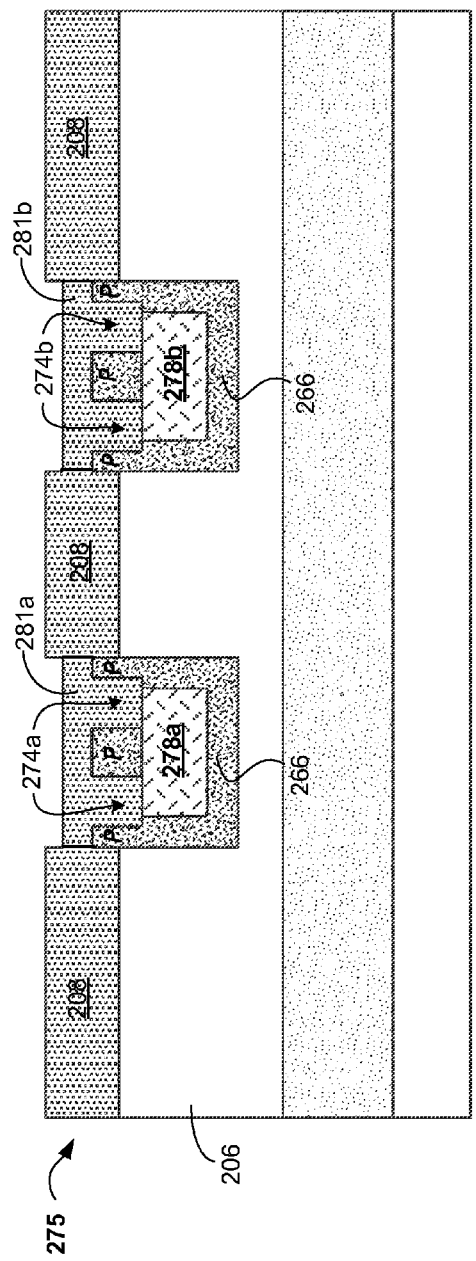
FIG. 2K
FIG. 2K'

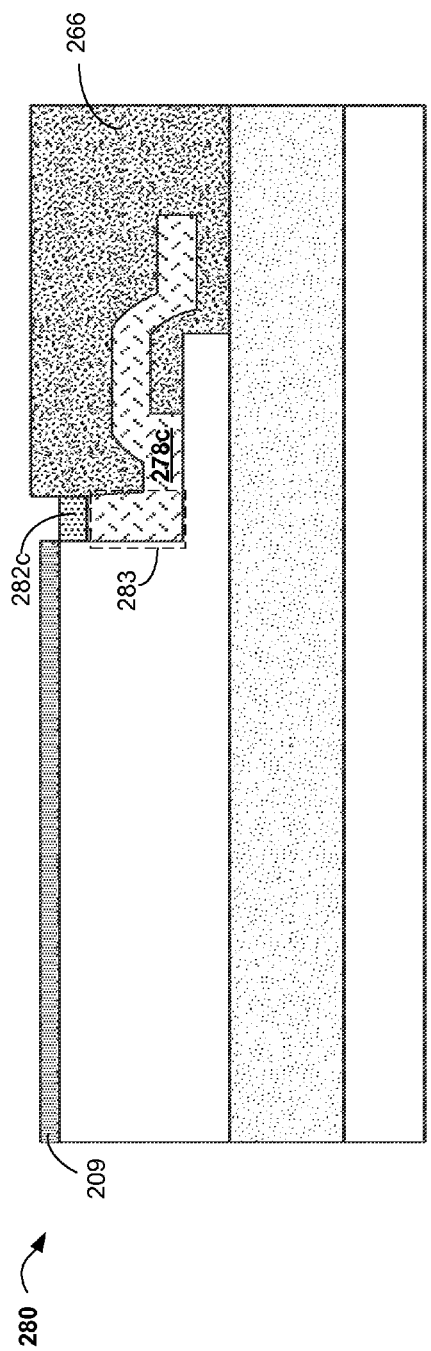
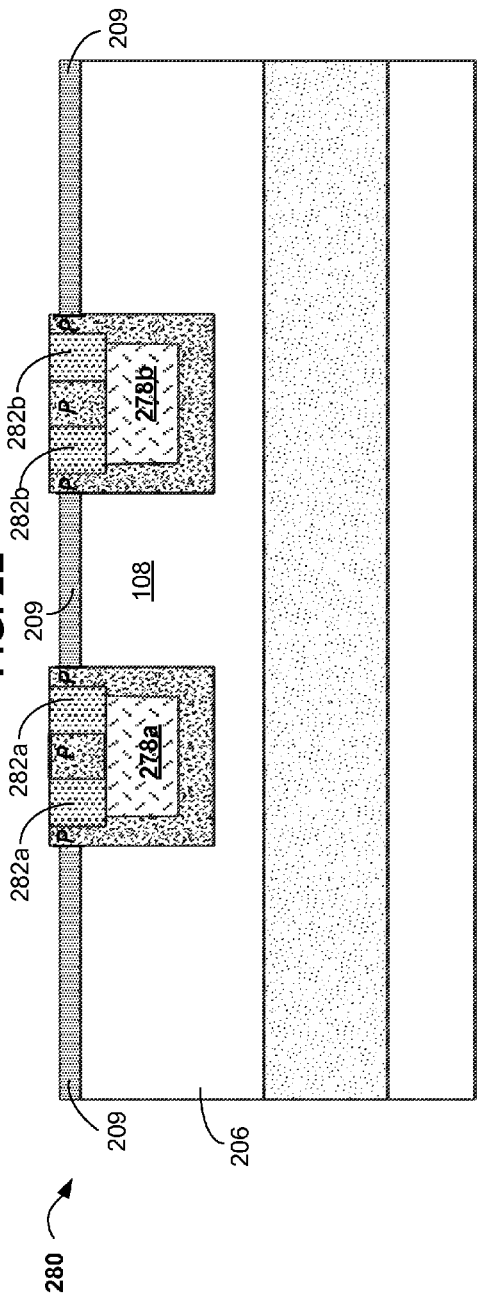
FIG. 2L
FIG. 2L'

BURIED WAVEGUIDE PHOTODETECTOR

BACKGROUND a. Field of the Invention

The present invention generally relates to semiconductor devices, and particularly to integrated photonic semiconductor devices.

b. Background of Invention

The use of both photonic devices in high-speed switching and transceiver devices in data communications are but a few examples that highlight the advantages of processing both optical and electrical signals within a single integrated device. For example, an integrated photonic device may include both photodetector and CMOS type devices that may be fabricated on a single substrate. As such, while engaging in the fabrication of one type of device (i.e., photonic devices); other device types (i.e., CMOS devices) may be impacted. In addition to mitigating adverse effects associated with the different fabrication processes corresponding to each type of device (i.e., photonic/CMOS devices), facilitating increased device performance within an integrated photonic semiconductor device structure may be desirable.

It may therefore, among other things, be advantageous to fabricate, within an integrated photonic device, photodetector device structures that have enhanced performance characteristics.

BRIEF SUMMARY

According to at least one exemplary embodiment, a method of forming an integrated photonic semiconductor structure having a photodetector device and a CMOS device may include forming a well region for the CMOS device, forming an isolation region for electrically isolating the photodetector device from the well region, and forming a semiconductor optical waveguide for propagating optical signals. Within the isolation region, germanium material may be deposited adjacent to a first portion of opposing side walls of the semiconductor optical waveguide, whereby the first portion of the opposing sidewalls are parallel with a travel direction of the propagating optical signals within the optical waveguide. The deposited germanium material may form an active region of the photodetector device for evanescently receiving the propagating optical signals from the first portion of the opposing sidewalls of the semiconductor optical waveguide structure.

According to at least one other exemplary embodiment, a method of forming an integrated photonic semiconductor structure having a photodetector device and a CMOS device may include forming the CMOS device on a first silicon-on-insulator region, forming a silicon optical waveguide on a second silicon-on-insulator region, and forming a shallow trench isolation region surrounding the silicon optical waveguide, whereby the shallow trench isolation electrically isolates the first and the second silicon-on-insulator region. Within a first region of the shallow trench isolation region, first germanium material may be deposited adjacent a first side wall of the semiconductor optical waveguide. Also, within a second region of the shallow trench isolation region, second germanium material may be deposited adjacent a second side wall of the semiconductor optical waveguide, whereby the second side wall opposes the first side wall. The deposited first and the deposited second germanium material form an active region of the photodetector device for evanescently receiving propagating optical signals from the first and the second side wall of the semiconductor optical waveguide.

According to at least one other exemplary embodiment, an integrated photonic semiconductor structure may include a substrate, an isolation region, a CMOS device located on the substrate; and a semiconductor optical waveguide structure located on the substrate and electrically isolated from the CMOS device by the isolation region. The semiconductor optical waveguide structure includes a first side wall and a second side wall that opposes the first side wall. A photodetector is located within the isolation region and includes a first and a second germanium active region. The first germanium active region is located adjacent to the first side wall of the waveguide structure and the second germanium active region is located adjacent to the second side wall of the waveguide structure. The first and the second germanium active region evanescently receive propagating optical signals from the first and the second side wall of the semiconductor optical waveguide.

According to at least one other exemplary embodiment, a design structure tangibly embodied in a machine readable medium for designing, manufacturing, or testing an integrated circuit is provided. The design structure may include a substrate, an isolation region, a CMOS device located on the substrate; and a semiconductor optical waveguide structure located on the substrate and electrically isolated from the CMOS device by the isolation region. The semiconductor optical waveguide structure includes a first side wall and a second side wall that opposes the first side wall. A photodetector is located within the isolation region and includes a first and a second germanium active region. The first germanium active region is located adjacent to the first side wall of the waveguide structure and the second germanium active region is located adjacent to the second side wall of the waveguide structure. The first and the second germanium active region evanescently receive propagating optical signals from the first and the second side wall of the semiconductor optical waveguide.

BRIEF DESCRIPTION OF THE SEVERAL VIEWS OF THE DRAWINGS

FIG. 1A is a plan view of an integrated photonic semiconductor device structure including a seed window according to an exemplary embodiment;

FIG. 1B is a plan view of the integrated photonic semiconductor device structure of FIG. 1A, whereby the seed window is removed according to an exemplary embodiment;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 2A:
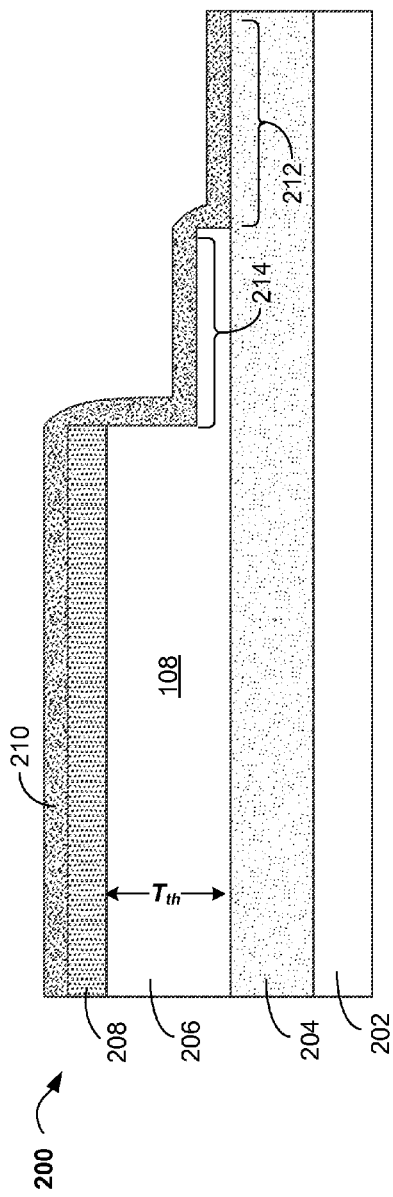
FIGS. 2A-2O are cross-sectional views corresponding to the fabrication of the integrated photonic semiconductor device structure of FIGS. 1A & 1B, according to an exemplary embodiment.
Figure 2A:
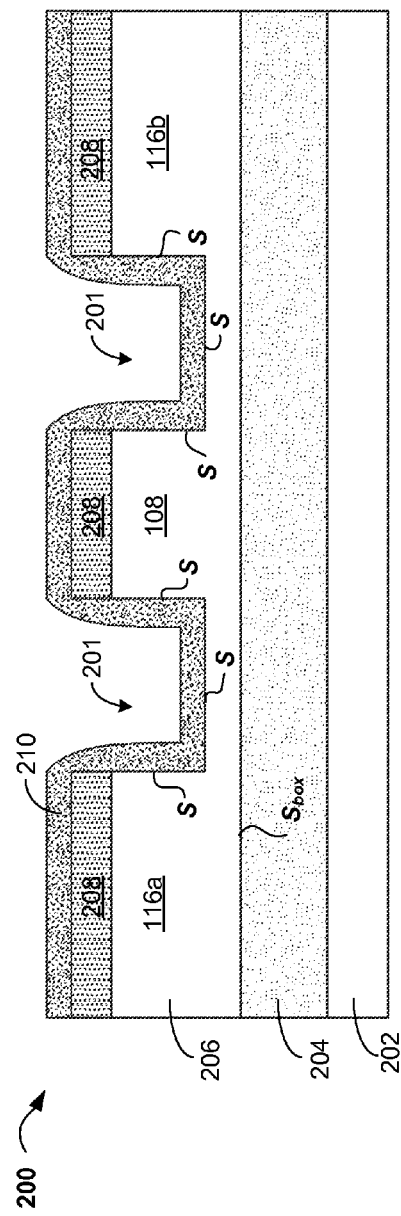

The following describes an exemplary embodiment of an integrated photonic semiconductor device structure and corresponding fabrication processes, whereby the integrated photonic semiconductor device structure includes a buried waveguide photodetector device created within a shallow trench isolation (STI) region that electrically isolates the photodetector device from one or more adjacent CMOS devices.

In particular, the following structure and processes may provide an exemplary embodiment of a CMOS integrated nanophotonics device that includes, for example, both a photonic device such as a germanium (Ge) photodetector and a CMOS device such as an FET. Within CMOS integrated nanophotonic circuits, crystalline materials such as germanium or III-V compounds may be utilized as an active element of the photodetector component based on their high quantum efficiency. Using a rapid melt growth technique, films (e.g., germanium) can be deposited at low temperatures in an amorphous state using techniques such as physical vapor deposition (PVD), reduced pressure chemical vapor deposition (RPCVD), plasma enhanced chemical vapor deposition (PECVD), and rapid thermal chemical vapor deposition (RTCVD), and subsequently crystallized thermally. In order to produce a single crystalline germanium (Ge) active region, for example, a deposited amorphous state germanium film may be crystallized by heating the semiconductor wafer over which the germanium film is deposited to about 1100 degrees centigrade (° C.). At around 940° C., the germanium film transforms from a solid state to a liquid state. During a subsequent cooling stage, the liquid germanium is transformed back to a solid as a single crystalline germanium material for forming, for example, a photodetector active region.

FIG. 1A is a plan view of an integrated photonic semiconductor device structure 100A including a seed window 102 according to one exemplary embodiment. As depicted, a photodetector structure 104 may include opposing side portions 106a, 106b that are formed adjacent to a semiconductor waveguide structure 108 having opposing sidewalls 110a and 110b. Accordingly, side portion 106a of the photodetector 104 is adjacent to sidewall 110a of the waveguide structure 108. Also, side portion 106b of the photodetector 104 is adjacent to sidewall 110b of the waveguide structure 108. As an optical signal (e.g., 1310 nm or 1550 nm wavelength) propagates within the waveguide 108 along the direction of arrow X, the optical signal is evanescently coupled to opposing side portions 106a and 106b of the photodetector 104 via a first portion $P_1$ of opposing sidewalls 110a and 110b corresponding to waveguide structure 108, respectively. An end portion 106c of the photodetector structure 104 may abut the end wall 110c of waveguide structure 108 and couple the opposing side portions 106a, 106b of the photodetector 104. The side portions 106a, 106b and the end portion 106c may form the germanium active region of the photodetector 104. The side portions 106a, 106b and the end portion 106c of the photodetector 104 are formed within STI region 114 of the integrated photonic semiconductor device structure 100A. As illustrated, active regions 116a and 116b may be utilized to fabricate CMOS devices such as one or more FET transistor devices (not shown), whereby the active regions 116a, 116b are electrically isolated from the photodetector 104 and waveguide structure 108 via the STI region 114.

During the formation of the photodetector 104 germanium active region, the seed window 102 facilitates the establishment of contact between the deposited germanium film material with the silicon material of optical waveguide 108. This contact enables the germanium film to utilize the silicon material of optical waveguide 108 as a seed layer during the crystallization process described above. Consequently, upon crystallization, the germanium active region including portions 106a, 106b, and 106c is formed.

The optical waveguiding may be provided based on the waveguide structure 108 acting as a core having a first refractive index, and the surrounding STI material, as defined by $C_{cl}$, functioning as a cladding having a second refractive index. The relationship between the first and the second refractive index may be such that, at second portion $P_2$ of the waveguide's 108 opposing sidewalls 110a, 110b, the optical signal is internally guided within the core with little to no light leaking into the cladding (i.e., $C_{cl}$). However, the side portions 106a, 106b of the photodetector 104 are adjacent to the sidewalls 110a, 110b of the waveguide 108 via a liner 115 of STI material that acts as the cladding, such that light is evanescently coupled from portion $P_1$ the waveguide structure 108 acting as the core into the side portions 106a, 106b.

Referring to integrated photonic semiconductor device structure 100B of FIG. 1B, the end portion 106c (FIG. 1A) of the photodetector 104, which is, among other things, used to provide the seed window 102 (FIG. 1A), may be removed.

Figure 2H:
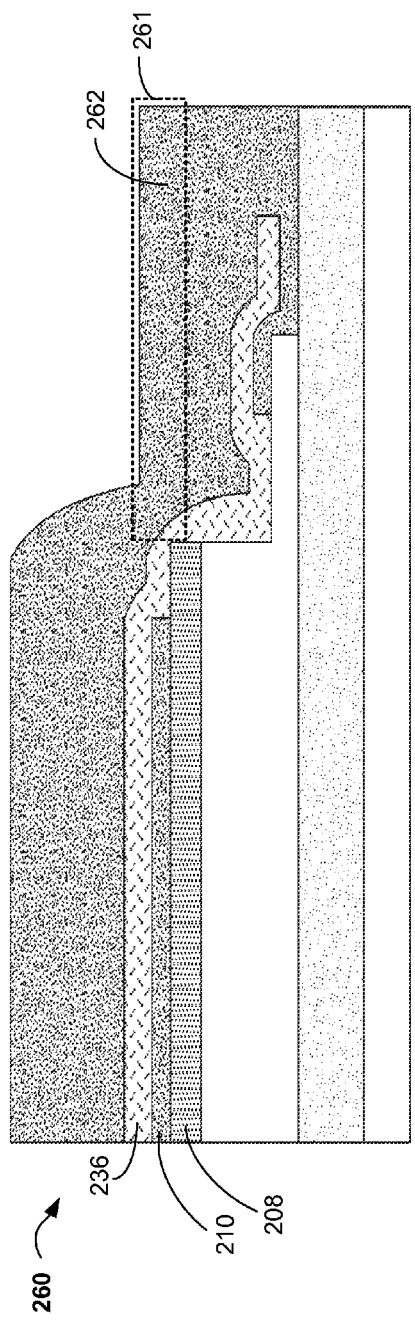
Figure 2H:
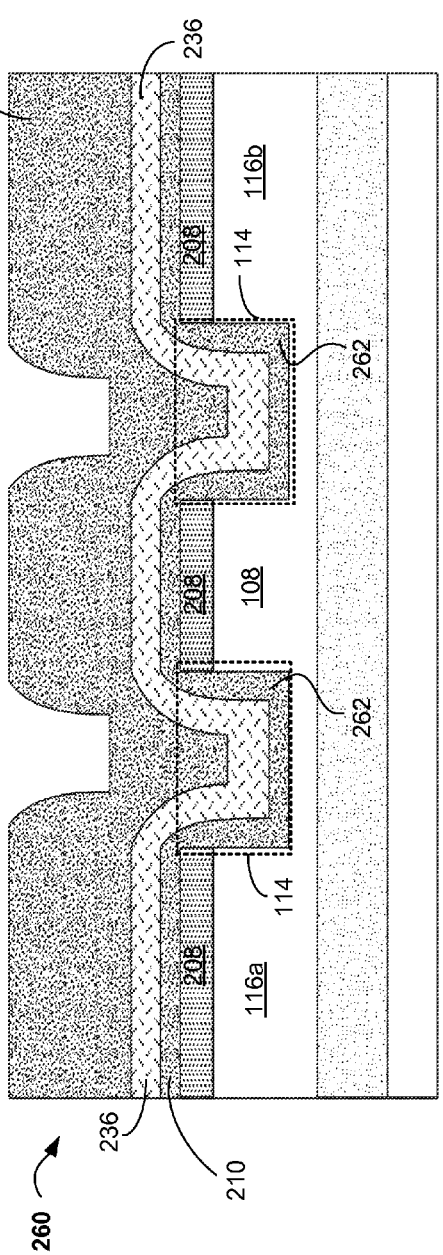
Figure 2M:
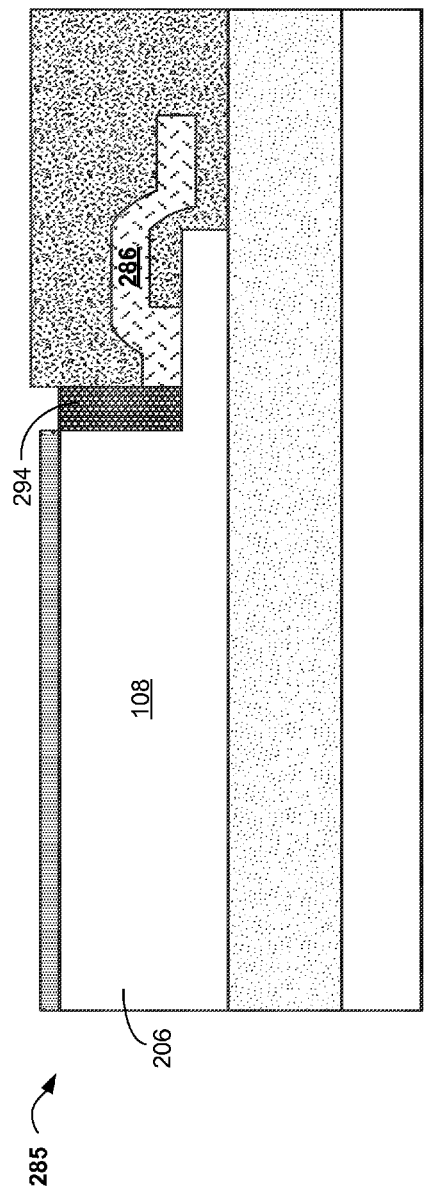
Figure 2M:
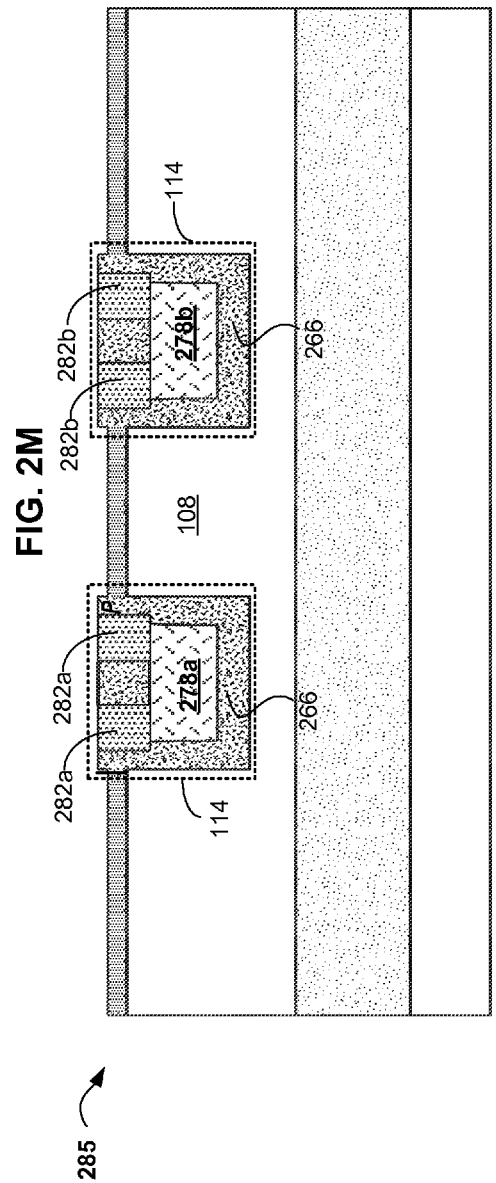
Figure 2N:
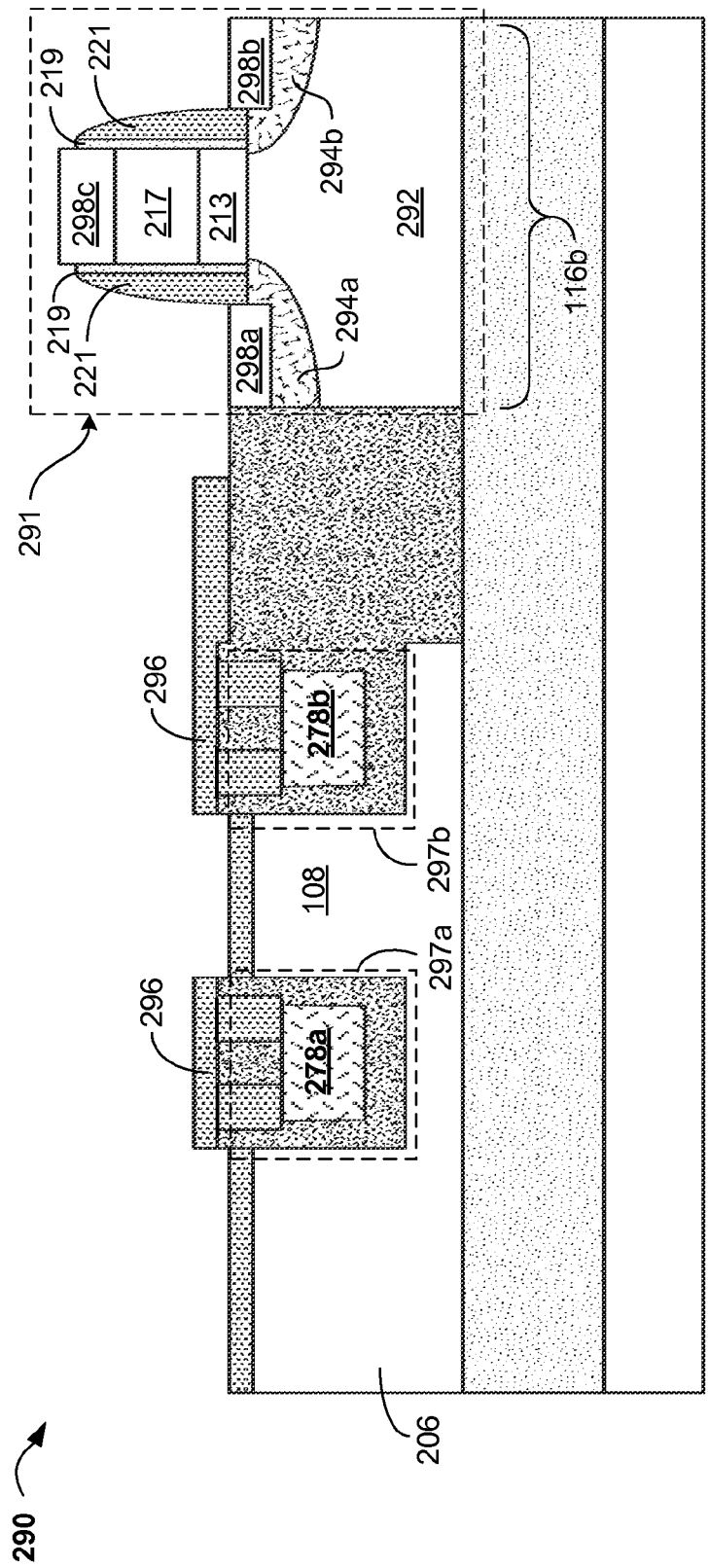
Figure 2O:
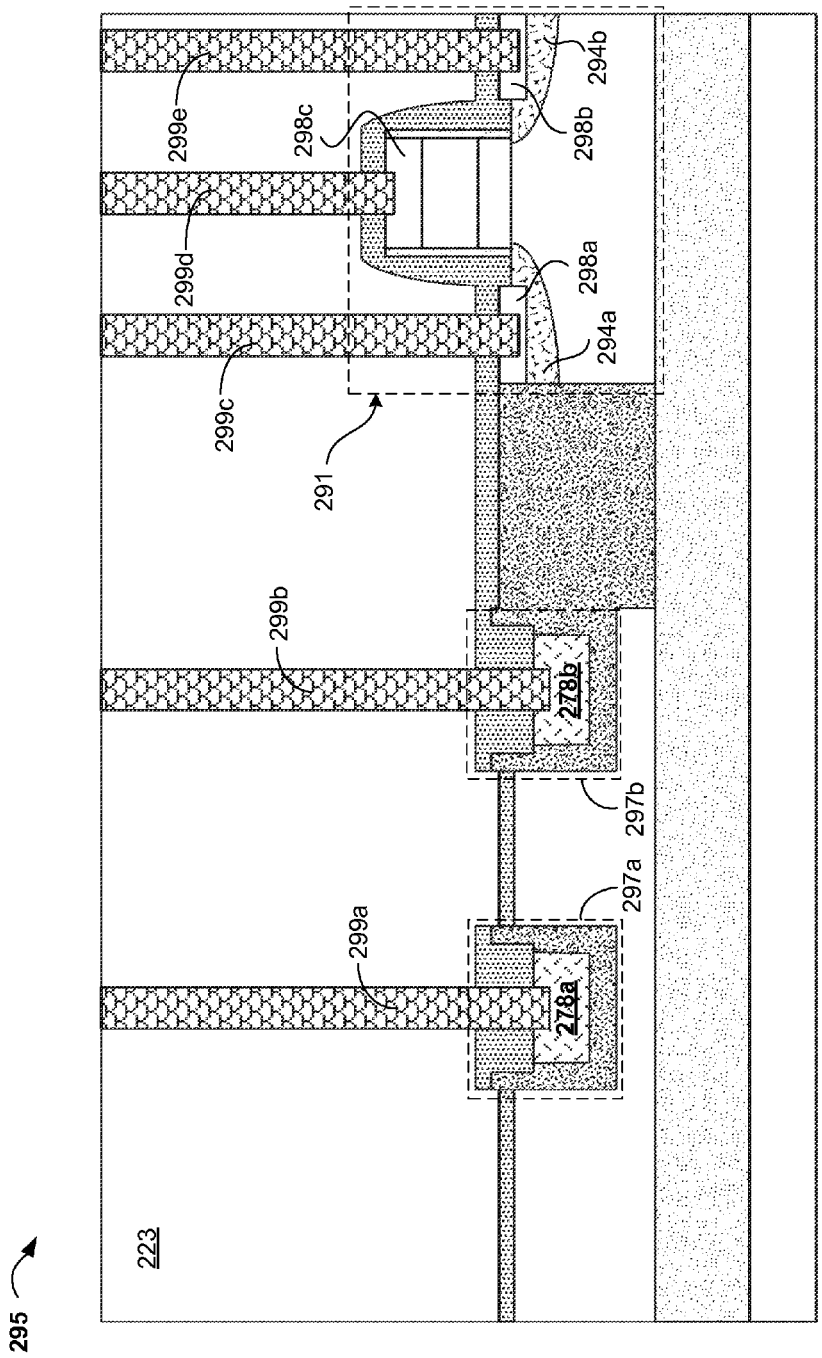

FIGS. 2A-2O are cross-sectional views corresponding to the fabrication of the integrated photonic semiconductor device structure 100A of FIG. 1A, according to an exemplary embodiment. In particular, FIGS. 2A-2O illustrate integrated photonic semiconductor device processes for forming a photonic device such as a photodetector within an STI region utilized from electrically isolating the photodetector from CMOS devices such FET transistors. The figures (i.e., FIGS. 2A-2O) include two cross sectional view taken along axis A-A' and B-B' of FIG. 1A. For example, FIG. 2A is a cross sectional view of a semiconductor structure taken across axis A-A' of FIG. 1A, while FIG. 2A' is a cross sectional view of the same semiconductor structure taken across axis B-B' of FIG. 1A.

FIG. 2A refers to a cross sectional view of integrated photonic semiconductor structure 200 taken along axis A-A' of FIG. 1A. As depicted, structure 200 includes a silicon (Si) substrate 202, a buried oxide (BOX) layer 204 formed over the Si substrate 202, and a silicon-on-insulator (SOI) region 206 corresponding to the waveguide structure 108 formed over the BOX layer 204. The SOI region 206 may be utilized as an active (Rx) region for creating both photonic (e.g., silicon optical waveguides) and CMOS (e.g., FET transistor devices) type device structures. The SOI region 206 may have a thickness, as defined by Tth, of, for example, 220 nm for 1550 nm optical wavelengths and 170 nm for 1310 nm optical wavelengths. A silicon nitride ($Si_3N_4$) layer 208 may be deposited over the SOI region 206 for the purpose of, for example, acting as a polish stop during subsequent process steps. A layer of oxide 210 having a thickness of about 20-40 nm is deposited over a portion 212 of the BOX layer 204, a portion 214 of the SOI region, and over the silicon nitride layer 208. Region 212 may be formed by photolithographic patterning and dry etching (e.g., RIE etching) of a SOI layer (not shown) located over BOX layer 204. A subsequent photolithographic patterning and partial dry etching (e.g., RIE etching) process may be carried out in order to then form portion 214 of the SOI region 206. Based on the partial etching of the SOI layer, portion 214 is created in the shape of a step having a thickness of about 50 nm. In subsequent process steps, region 214 may be used to form a seed window for the crystallization of the deposited germanium material used to from the active region of the photodetector 104 (FIG. 1A).

FIG. 2A' refers to a cross sectional view of integrated photonic semiconductor structure 200 taken along axis B-B' of FIG. 1A. As depicted, structure 200 along B-B' also includes Si substrate 202, BOX layer 204 formed over the Si substrate 202, and SOI region 206 formed over the BOX layer 204. The illustrated SOI region 206 along B-B' includes both waveguide structure 108 and active regions 116a and 116b. The silicon nitride ($Si_3N_4$) layer 208 is deposited over the waveguide structure 108 and active regions 116a, 116b of the SOI region 206. As shown, oxide 210 is deposited over silicon nitride ($Si_3N_4$) layer 208 and the surfaces S of SOI region 206. Alternatively, the SOI region 206 may be etched to form STI regions 201 such that the etch stops on the top surface $S_{box}$ of BOX 204 for regions that will subsequently become photodetector regions on the sidewall of the optical waveguide.

FIG. 2B refers to a cross sectional view of integrated photonic semiconductor structure 215 taken along axis A-A' of FIG. 1A. The integrated photonic semiconductor structure 215 may be formed by depositing an anti-reflection coating 218 and patterned photoresist layer 220 over integrated photonic semiconductor structure 200. The anti-reflection coating 218 may be deposited over the structure 200 (FIG. 2A) to create a planar surface for receiving a photoresist layer, which is then patterned to create patterned photoresist layer 220. The opening 222 in the patterned photoresist layer 220 is utilized in order to form the seed window 102 (FIG. 1A) described above.

FIG. 2B' refers to a cross sectional view of the integrated photonic semiconductor structure 215 taken along axis B-B' of FIG. 1A. As depicted, the deposited anti-reflection coating 218 conformally covers both waveguide structure 108 and active regions 116a and 116b.

FIG. 2C refers to a cross sectional view of integrated photonic semiconductor structure 225 taken along axis A-A' of FIG. 1A. The integrated photonic semiconductor structure 225 may be formed by etching the oxide layer 210 (FIG. 2B) of integrated photonic semiconductor structure 215 (FIG. 2B) via the patterned photoresist layer 220. As depicted, within opening 222, the oxide layer 210 (FIG. 2B) may be etched (e.g., RIE etch) selective to the silicon nitride layer 208 and silicon region 228. Thus, only the dotted regions 230, 232 of the oxide layer 210 (FIG. 2B) are etched away leaving oxide regions 234 and 236, which are protected by the patterned photoresist layer 220. By removing oxide from dotted region 232, during subsequent germanium deposition processes, the deposited amorphous germanium material contacts silicon region 228 to produce a Ge seed layer.

FIG. 2C' refers to a cross sectional view of the integrated photonic semiconductor structure 225 taken along axis B-B' of FIG. 1A. As depicted, the deposited anti-reflection coating 218 conformally covers both waveguide structure 108 and active regions 116a and 116b.

FIG. 2D refers to a cross sectional view of integrated photonic semiconductor structure 235 taken along axis A-A' of FIG. 1A. The integrated photonic semiconductor structure 235 may be formed by depositing a layer of germanium material 236 over integrated photonic semiconductor structure 225 (FIG. 2C) once the anti-reflection coating 218 (FIG. 2C) and the patterned photoresist 220 (FIG. 2C) layers have been striped away. The Ge layer 236 may be deposited using PVD, PECVD, RTCVD, or RPCVD deposition methods. The thickness of the deposited layer of germanium material may be about 50-200 nm. It may be appreciated that in place of germanium, other materials such as III-V materials may be used to form a photodetector active region.

FIG. 2D' refers to a cross sectional view of the integrated photonic semiconductor structure 235 taken along axis B-B' of FIG. 1A. As depicted, the deposited Ge layer 236 conformally covers both waveguide structure 108 and active regions 116a and 116b.

FIG. 2E refers to a cross sectional view of integrated photonic semiconductor structure 240 taken along axis A-A' of FIG. 1A. The integrated photonic semiconductor structure 240 may be formed by depositing another anti-reflection coating 242 over the deposited Ge layer 236 of integrated photonic semiconductor structure 235 (FIG. 2D). A patterned layer of photoresist 244 is then formed over the deposited anti-reflection coating 242. As depicted, photoresist 244 may include an opening 246.

FIG. 2E' refers to a cross sectional view of the integrated photonic semiconductor structure 240 taken along axis B-B' of FIG. 1A. As depicted, the deposited anti-reflection coating 242 and patterned layer of photoresist 244 conformally cover the deposited Ge layer 236 located over both waveguide structure 108 and active regions 116a and 116b.

FIG. 2F refers to a cross sectional view of integrated photonic semiconductor structure 245 taken along axis A-A' of FIG. 1A. The integrated photonic semiconductor structure 245 may be formed by etching integrated photonic semiconductor structure 240 via opening 246 of the photoresist 244. As depicted, regions of the anti-reflection coating 242, as indicated at 248, and the Ge layer 236, as indicated at 250, are etched away. Thus, the Ge material is removed from non-photodetector areas of the integrated photonic semiconductor structure 245 in order to preserve the real-estate of the semiconductor structure 245 for the subsequent fabrication of, for example, FETs, other CMOS devices, optical modulators, or other photonic type devices.

FIG. 2F' refers to a cross sectional view of the integrated photonic semiconductor structure 245 taken along axis B-B' of FIG. 1A. As depicted, the deposited anti-reflection coating 242 and patterned layer of photoresist 244 remain conformally covering the deposited GE layer 236 located over both waveguide structure 108 and active regions 116a and 116b.

FIG. 2G refers to a cross sectional view of integrated photonic semiconductor structure 255 taken along axis A-A' of FIG. 1A. The integrated photonic semiconductor structure 255 may be formed by striping the anti-reflection coating 242 (FIG. 2F) and the patterned layer of photoresist 244 (FIG. 2F) from integrated photonic semiconductor structure 245 (FIG. 2F). As also depicted in FIG. 2G', the anti-reflection coating 242 and the patterned layer of photoresist 244 are removed from over the Ge layer 236. The photoresist 244 and anti-reflection coating 242 may be removed using, for example, an oxygen ($O_2$) plasma strip followed by a DHF (Diluted HF acid) process to avoid striping the underlying Ge layer.

FIG. 2H refers to a cross sectional view of integrated photonic semiconductor structure 260 taken along axis A-A' of FIG. 1A. The integrated photonic semiconductor structure 260 may be formed by depositing a thick oxide fill 262 such as silicon dioxide ($SiO_2$) material over integrated photonic semiconductor structure 255 (FIG. 2G). The deposited oxide fill 262 may have a thickness in the range of about 3000-6000 Angstroms (Å). For example, the thick oxide fill 262 may be deposited using a high density plasma (HDP) deposition process.

FIG. 2H' refers to a cross sectional view of the integrated photonic semiconductor structure 260 taken along axis B-B' of FIG. 1A. As depicted, the thick oxide fill 262 may act as an electrical insulating material utilized within the shallow trench isolation region 114 (also see FIG. 1A), which electrically isolates the active regions 116a, 116b and the waveguide structure 108. In subsequent processing steps described in the following paragraphs, a photodetector may be formed adjacent to the opposing sidewalls of the waveguide structure 108. Accordingly, the thick oxide fill 262 (e.g., SiO$_2$) also isolates the formed photodetector from any other devices (e.g., CMOS FETs) that are created using the active regions 116a, 116b.

FIG. 2I refers to a cross sectional view of integrated photonic semiconductor structure 265 taken along axis A-A' of FIG. 1A. The integrated photonic semiconductor structure 265 may be formed by planarizing integrated photonic semiconductor structure 260 using chemical mechanical polishing (CMP). As depicted, the entire oxide fill 262 (FIG. 2H), the Ge layer 236 (FIG. 2H), and the oxide 210 (FIG. 2H) located above silicon nitride layer 208 is removed. During the CMP process, approximately 10-20% of the silicon nitride layer 208 may also be removed in order to ensure that no residual material remains on the surface of the silicon nitride layer 208. Also, region 261 (FIG. 2H), which includes a portion of the oxide fill 262 (FIG. 2H) and a portion of the Ge layer 236 (FIG. 2H), is removed during the CMP process. Thus, following the CMP process, Ge regions 268a-268c and oxide fill 266 remain.

FIG. 2I' refers to a cross sectional view of the integrated photonic semiconductor structure 265 taken along axis B-B' of FIG. 1A. As depicted, following the CMP process, no oxide fill 262 remains above the silicon nitride layer 208. Also, remaining Ge regions 268a-268b are each surrounded by the remaining oxide fill 266 of the STI region 114. A portion 269a of the remaining oxide fill 266 located between Ge region 268a and the sidewall 110a of the waveguide structure 108 includes an oxide liner 271a. Similarly, portion 269b of the remaining oxide fill 266 located between Ge region 268b and sidewall 110b of the waveguide structure 108 includes oxide liner 271b. Thus, in operation, optical signals are coupled from the waveguide structure 108 to adjacent Ge regions 268a and 268b via oxide liners 271a and 271b, respectively. The existing oxide liners 271a and 271b located between the Ge regions 268a-268b and the silicon optical waveguide structure 108 may facilitate the avoidance of the intermixing of germanium from the Ge regions 268a-268b with the silicon of the waveguide structure 108. For example, one effect of such intermixing would be to reduce the responsivity of the Ge regions 268a-268b, which form the active region of the photodetector 104 (see FIG. 1A). Thus, the oxide liners 271a, 271b mitigate intermixing while allowing the evanescent coupling of optical signals from the waveguide structure to the Ge regions 268a-268b.

FIG. 2J refers to a cross sectional view of integrated photonic semiconductor structure 270 taken along axis A-A' of FIG. 1A. The integrated photonic semiconductor structure 270 may be formed by creating recess region 272. Recess region 272 may be formed by etching (e.g., RIE etch) portion 273 (FIG. 2I) of Ge region 268c (FIG. 2I) corresponding to integrated photonic semiconductor structure 265 (FIG. 2I). The recess depth of recess region 272 may be about 20-30% of the thickness $T_{th}$ (FIG. 2I) of the Ge region 268c (FIG. 2I).

FIG. 2J' refers to a cross sectional view of the integrated photonic semiconductor structure 270 taken along axis B-B' of FIG. 1A. As depicted, recess regions 274a and 274b may be formed by etching (e.g., RIE etching) portions 276a and 276b (FIG. 2I') of respective Ge regions 268a and 268b (FIG. 2I') corresponding to integrated photonic semiconductor structure 265 (FIG. 2I'). As depicted in FIGS. 2J and 2J', following the recessing, Ge regions 278a-278c are formed.

FIG. 2K refers to a cross sectional view of integrated photonic semiconductor structure 275 taken along axis A-A' of FIG. 1A. FIG. 2K' refers to a cross sectional view of integrated photonic semiconductor structure 275 taken along axis B-B' of FIG. 1A. As depicted in FIGS. 2K and 2K', the integrated photonic semiconductor structure 275 may be formed by filling recess regions 272, 274a, and 274b with respective silicon nitride fill materials 279, 281a, and 281b.

FIG. 2L refers to a cross sectional view of integrated photonic semiconductor structure 280 taken along axis A-A' of FIG. 1A. The integrated photonic semiconductor structure 280 may be formed by stripping, using phosphoric acid (H$_3$PO$_4$), the silicon nitride material layers 208, 279 (FIG. 2K) of integrated photonic semiconductor structure 275 (FIG. 2K). As depicted in FIG. 2L, the nitride stripping process is performed to the extent that silicon nitride fill material 279 (FIG. 2K) is removed from over oxide fill 266. Silicon nitride plug 282c, however, remains over, and facilitates, the encapsulation of Ge region 278c in order to protect the germanium material from subsequent fabrication processes such as cleans.

FIG. 2L' refers to a cross sectional view of integrated photonic semiconductor structure 280 taken along axis B-B' of FIG. 1A. As depicted, the nitride stripping process is performed to the extent that the top layers of silicon nitride fill materials 274a and 274b (FIG. 2K') are removed from over the top surface of portions P of the oxide fill material 266. Pad oxide layer 209 may include a very slow etch rate in phosphoric acid compared to silicon nitride and, therefore, the pad oxide 209 provides for an etch stop during the above-described nitride stripping process in phosphoric acid. Although not shown, in all figures, the pad oxide layer 209 may be sandwiched between pad nitride layer 208 and SOI region 206. The pad oxide layer 209 may have a thickness of about between 30-200 Å. As illustrated, silicon nitride plugs 282a and 282b remain over, and facilitate, the encapsulation of Ge regions 278a and 278b, respectively, in order to protect the germanium material from subsequent fabrication processes such as cleans.

At the current process stage dopant implants (e.g., phosphorus for N-well regions and boron for P-well regions) may be introduced within a well region 292 (FIG. 2N) of a CMOS device such as an FET transistor 291 (FIG. 2N). A thermal anneal process may be carried out for simultaneously initiating both the activation of the well dopants within the well region 292 (FIG. 2N) and the crystallization of the germanium regions 278a-278c that may form the photodetector active region. For example, the thermal anneal process may include heating integrated photonic semiconductor structure 280 to a temperature of about 1030° C. for a period of approximately 5 seconds.

FIG. 2M refers to a cross sectional view of integrated photonic semiconductor structure 285 taken along axis A-A' of FIG. 1A. The integrated photonic semiconductor structure 285 may be formed by removing, from integrated photonic semiconductor structure 280 (FIG. 2L), the silicon nitride plug 282c (FIG. 2L) and Ge region 283 (FIG. 2L) underlying the silicon nitride plug 282c (FIG. 2L), using for example, either a wet or dry etch process. Once the silicon nitride plug 282c (FIG. 2L) and the Ge region 283 (FIG. 2L) are removed, a fill material 294 such as polysilicon, spacer oxide, or spacer nitride may be deposited within the opening (not shown) located between the optical waveguide structure 108 and Ge region 286. Thus, the seed window where the germanium contacts the silicon material of the waveguide 108 is now removed and filled (also see FIG. 1B).

FIG. 2M' refers to a cross sectional view of integrated photonic semiconductor structure 285 taken along axis B-B' of FIG. 1A. As depicted, Ge region 278a is adjacent to waveguide structure 108 and encapsulated by the silicon nitride plugs 282a and the oxide fill 266 corresponding to STI region 114. Similarly, Ge region 278b is also adjacent to waveguide structure 108 and encapsulated by the silicon nitride plugs 282b and the oxide fill 266 corresponding to STI region 114.

FIG. 2N refers to a cross sectional view of integrated photonic semiconductor structure 290 taken along axis B-B' of FIG. 1A. CMOS FET transistor 291 is formed adjacent to the photodetector device, which includes Ge regions 278a and 278b, whereby the Ge regions 278a, 278b are laterally displaced by optical waveguide 108. In the depicted exemplary embodiment, the formed CMOS FET transistor 291 may include a gate dielectric 213, a polysilicon gate electrode 217, spacer oxide regions 219, spacer nitride regions 221, source/drain (S/D) regions 294a, 294b, and halo and extension implants (not shown). Well region 292 and the S/D regions 294a, 294b of FET transistor 291 may be formed within active region 116b the silicon-on-insulator (SOI) layer 206. A lithographically patterned and etched layer of silicon nitride 296 may be formed over the photodetector regions 297a and 297b having Ge regions 278a and 278b, respectively. The patterned layer of silicon nitride 296 may protect the photodetector regions 297a, 297b from the formation of respective silicide regions 298a, 298b, and 298c on the S/D regions 294a, 294b and the gate electrode 217.

FIG. 2O refers to a cross sectional view of integrated photonic semiconductor structure 295 taken along axis B-B' of FIG. 1A. Integrated photonic semiconductor structure 295 may be formed by creating electrical contacts for the photodetector regions 297a, 297b and CMOS FET transistor 291 of integrated photonic semiconductor structure 290 (FIG. 2N). As depicted, integrated photonic semiconductor structure 295 may be formed by depositing an interlayer dielectric material 223 over integrated photonic semiconductor structure 290 (FIG. 2N). The interlayer dielectric material 223 may, for example, include 5000-10,000 Å of BPSG material. The contacts 299a-299e may be formed by etching into the interlayer dielectric 223. For example, contact 299a establishes an electrically conductive connection with Ge region 278a of photodetector region 297a, contact 299b establishes an electrically conductive connection with Ge region 278b of photodetector region 297b, contact 299c establishes an electrically conductive connection with silicide region 298a of S/D region 294a, contact 299d establishes an electrically conductive connection with gate silicide region 298c, and contact 299e establishes an electrically conductive connection with silicide region 298b of S/D region 294b.

Thus, the integrated photonic semiconductor structure 295 embodiment includes a photodetector formed from the Ge region 278a of photodetector region 297a and the Ge region 278b of photodetector region 297b. Both Ge region 278a and 278b form the photodetector's active region for facilitating optical to electrical signal conversion. Since Ge regions 278a and 278b collect optical signals or light from both sides of the waveguide 108, for a given responsivity, the size of the photodetector active region can be reduced by approximately a factor of two (×2). By reducing the photodetector active region dimension by ×2, the response of the photodetector accordingly increases by ×2. Alternatively, if light was collected from only one side of the waveguide 108, for the same responsivity, the length of the Ge region would have to be doubled, which would in turn reduce the speed of the photodetector by about one half. Moreover, the sidewall coupling of optical signals in exemplary structure 295 may eliminate the use of adiabatic tapers, as with top coupled photodetectors. Thus, photodetector speed may not be limited by the use of such adiabatic tapers. Also, the encapsulation of the Ge regions 278a, 278b on five sides by the oxide fill material of the STI region provides a robust photodetector structure.

Figure 3:
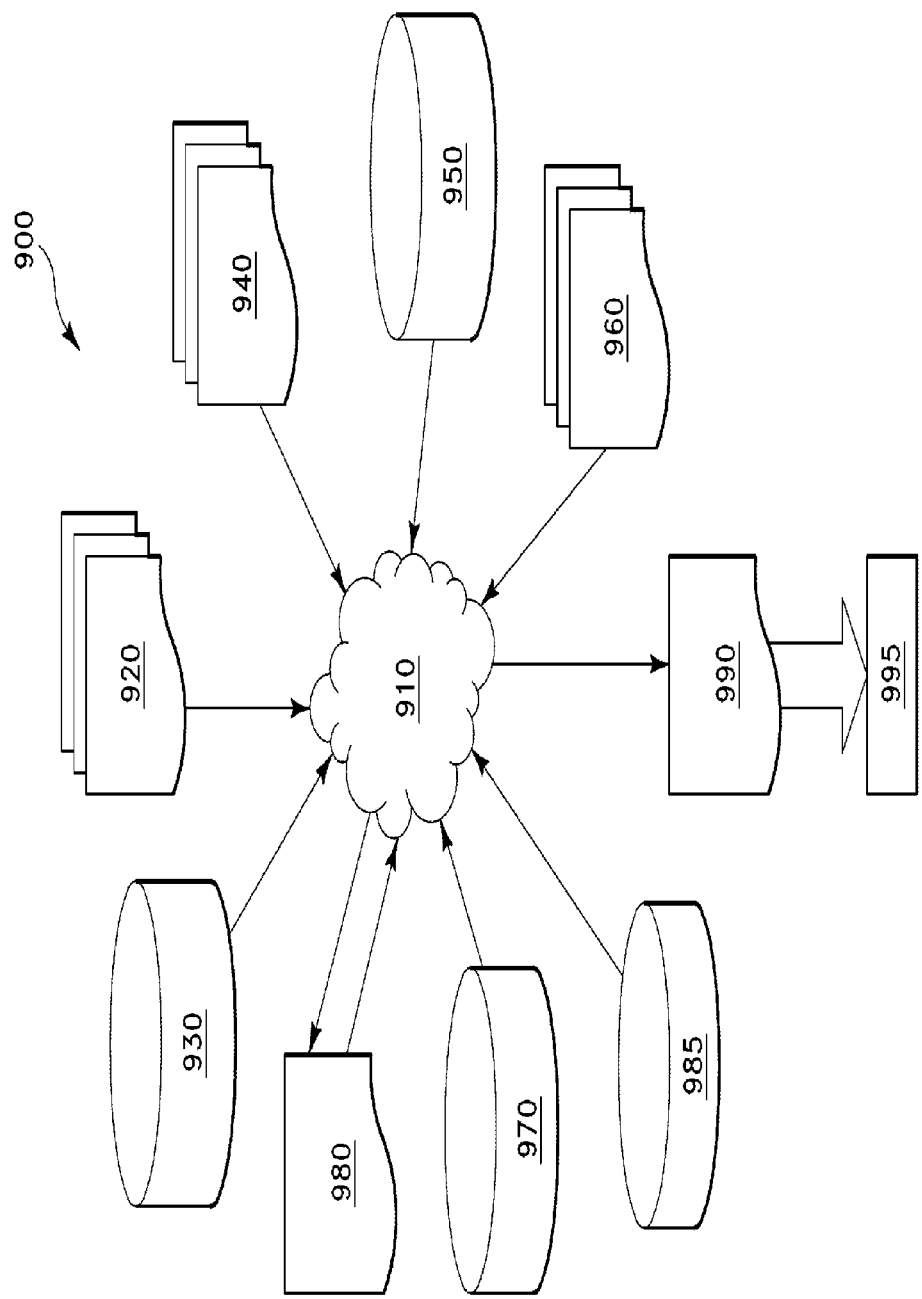
FIG. 3 is a flow diagram of a design process used in semiconductor design, manufacture, and/or test according to an exemplary embodiment.

FIG. 3 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIG. 2O. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 3 illustrates multiple such design structures including an input design structure 920 that is preferably processed by a design process 910. In one embodiment, the design structure 920 comprises design data used in a design process and comprising information describing the embodiments of the invention with respect to the structure as shown in FIG. 2O. The design data in the form of schematics or HDL, a hardware-description language (e.g., Verilog, VHDL, C, etc.) may be embodied on one or more machine readable media. For example, design structure 920 may be a text file, numerical data or a graphical representation of the embodiment of the invention shown in FIG. 2O. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as that shown in FIG. 2O. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structure shown in FIG. 2O to generate a netlist 980 which may contain a design structure such as design structure 920. Netlist 980 may comprise, for example, compiled or otherwise processed data structures representing a list of wires, discrete components, logic gates, control circuits, 110 devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 20, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of the embodiment of the invention shown in FIG. 2O. In one embodiment, design structure 990 may comprise a compiled, executable HDL simulation model that functionally simulates the device shown in FIG. 2O.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 2O. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiments, the practical application or technical improvement over technologies found in the marketplace, or to enable others of ordinary skill in the art to understand the embodiments disclosed herein.

What is claimed is:

1. An integrated photonic semiconductor structure comprising:
   a substrate;
   an isolation region;
   a CMOS device located on the substrate;
   a semiconductor optical waveguide structure located on the substrate and electrically isolated from the CMOS device by the isolation region, the semiconductor optical waveguide structure having a first side wall and a second side wall that opposes the first side wall;
   a photodetector located within the isolation region, the photodetector having a first and a second germanium active region, the first germanium active region located adjacent to the first side wall of the waveguide structure and the second germanium active region located adjacent to the second side wall of the waveguide structure,
   wherein the first and the second germanium active region evanescently receive propagating optical signals from the first and the second side wall of the semiconductor optical waveguide, and
   the first germanium active region is separated from the first side wall of the semiconductor optical waveguide by a first oxide liner, and the second germanium active region is separated from the second side wall of the semiconductor optical waveguide by a second oxide liner.

2. The structure of claim 1, wherein the first and the second oxide liner comprise oxide layers each having a thickness of about 20-40 nm.

3. The structure of claim 1, wherein the shallow trench isolation region comprises a silicon dioxide ($SiO_2$) fill material.

4. The structure of claim 1, wherein the first and the second germanium active region comprises a thickness of about 50-200 nm.

5. The structure of claim 1, wherein the semiconductor optical waveguide propagates optical signals having a wavelength of about 1550 nm.

6. The structure of claim 1, wherein the semiconductor optical waveguide propagates optical signals having a wavelength of about 1310 nm.

7. The structure of claim 1, further comprising a first contact within the first germanium active region.

8. The structure of claim 7, further comprising a second contact within the second germanium active region.

9. The structure of claim 8, wherein the first contact and the second contact establish an electrically conductive connection with the photodetector.

10. A design structure tangibly embodied in a machine readable medium for designing, manufacturing, or testing an integrated circuit, the design structure comprising:
   a substrate;
   an isolation region;
   a CMOS device located on the substrate;
   a semiconductor optical waveguide structure located on the substrate and electrically isolated from the CMOS device by the isolation region, the semiconductor optical waveguide structure having a first side wall and a second side wall that opposes the first side wall;
   a photodetector located within the isolation region, the photodetector having a first and a second germanium active region, the first germanium active region located adjacent to the first side wall of the waveguide structure and the second germanium active region located adjacent to the second side wall of the waveguide structure,
   wherein the first and the second germanium active region evanescently receive propagating optical signals from the first and the second side wall of the semiconductor optical waveguide, and
   the first germanium active region is separated from the first side wall of the semiconductor optical waveguide by a first oxide liner, and the second germanium active region is separated from the second side wall of the semiconductor optical waveguide by a second oxide liner.

11. The design structure of claim 10, wherein the first and the second oxide liner comprise oxide layers each having a thickness of about 20-40 nm.

12. An integrated photonic semiconductor structure comprising:
   a substrate;
   an isolation region;
   a CMOS device located on the substrate;
   a semiconductor optical waveguide structure located on the substrate and electrically isolated from the CMOS device by the isolation region, the semiconductor optical waveguide structure having a first side wall and a second side wall that opposes the first side wall;
   a photodetector located within the isolation region, the photodetector having a first and a second germanium active region, the first germanium active region located adjacent to the first side wall of the waveguide structure and the second germanium active region located adjacent to the second side wall of the waveguide structure,
   wherein the first and the second germanium active region evanescently receive propagating optical signals from the first and the second side wall of the semiconductor optical waveguide, and
   the first germanium active region is separated from the first side wall of the semiconductor optical waveguide and the second germanium active region is separated from the second side wall of the semiconductor optical waveguide.

* * * * *